(12) United States Patent
Lee

(10) Patent No.: US 6,473,350 B2
(45) Date of Patent: Oct. 29, 2002

(54) SEMICONDUCTOR MEMORY DEVICE HAVING MEMORY CELL ARRAY STRUCTURE WITH IMPROVED BIT LINE PRECHARGE TIME AND METHOD THEREOF

(75) Inventor: Seung-hoon Lee, Suwon (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/986,181

(22) Filed: Nov. 7, 2001

(65) Prior Publication Data

US 2002/0054503 A1 May 9, 2002

(30) Foreign Application Priority Data

Nov. 8, 2000 (KR) .......................................... 2000-66213

(51) Int. Cl.[7] ............................. G11C 7/02; G11C 11/24
(52) U.S. Cl. ........................ 365/207; 365/149; 365/210
(58) Field of Search ................................. 365/205, 207, 365/208, 149, 210

(56) References Cited

U.S. PATENT DOCUMENTS

| 5,706,244 | A | * | 1/1998 | Shimizu | 365/207 |
| 5,724,291 | A | * | 3/1998 | Matano | 365/207 |
| 5,793,689 | A | * | 8/1998 | Yoon et al. | 365/205 |
| 6,154,405 | A | * | 11/2000 | Takemae et al. | 365/210 |
| 6,404,661 | B2 | * | 6/2002 | Hidaka | 365/205 |

\* cited by examiner

Primary Examiner—Trong Phan
(74) Attorney, Agent, or Firm—Volentine Francos, PLLC

(57) ABSTRACT

A semiconductor memory device having a memory cell array structure and a precharging method, that improves bit line precharge time. The device has a common sense amplifier structure and includes memory cell blocks, first and second sense amplifiers and a dummy capacitor region. The first sense amplifier is arranged between and is shared by two adjacent memory cell blocks, to sense and detect data of memory cells. The second sense amplifier is connected to a memory cell block at an edge of the array structure, to sense and detect memory cell data. The dummy capacitor region includes capacitors between a dummy bit line and a complementary dummy bit line which are connected to the bit line and complementary bit line of the memory cell block at the edge of the array structure. The capacitors have a capacitance substantially equal to line capacitance of the bit line.

17 Claims, 5 Drawing Sheets

SEMICONDUCTOR MEMORY DEVICE HAVING MEMORY CELL ARRAY STRUCTURE WITH IMPROVED BIT LINE PRECHARGE TIME AND METHOD THEREOF

The present application claims priority under 35 U.S.C. §119 to Korean Application No. 2000-66213 filed on Nov. 8, 2000, which is hereby incorporated by reference in its entirety for all purposes.

BACKGROUND OF THE INVENTION

1. Field of the Invention

The present invention relates to a semiconductor memory device, and more particularly, to a memory cell array structure and method capable of improving bit line precharge time (tRP).

2. Description of the Related Art

In a semiconductor memory device, bit line precharge time is an important parameter that decides operational frequency characteristics. In a semiconductor memory device such as a DRAM, a precharge operation disables a word line and a bit line which are enabled by active operation. In other words, the precharge operation equalizes the voltage of the word line to 0V, and equalizes a bit line and a complementary bit line to a precharge voltage level.

The definition of precharge time (tRP) will be described with reference to FIG. 1. Referring to FIG. 1, a word line WL which is previously enabled is disabled in response to the activation of a precharge signal PRECH. Soon after, a bit line BL and a complementary bit line BLB are precharged from a particular voltage level previously sensed by a sense amplifier, that is, from a fully swung voltage level, to a precharge voltage VBL level.

In an active interval introduced by activation of a sensing signal BSENSE, the word line WL is enabled and the bit line BL and the complementary bit line BLB charge-share memory cell data. Thus, there is a difference in voltage between the bit line BL and the complementary bit line BLB. The bit line BL and the complementary bit line BLB have a voltage level fully swung by operations of the sense amplifier. Here, the time required for the sensing signal BSENSE to be activated after the precharge signal PRECH is activated is called the precharge time tRP.

The precharge time tRP is required for ensuring that the sense amplifier senses the voltage levels of the bit line BL and the complementary bit line BLB. As the precharge time tRP becomes shorter, the operational speed of a DRAM becomes faster.

FIG. 2 is a diagram of a conventional memory cell array structure 200. Referring to FIG. 2, the memory cell array structure 200 is formed to make two adjacent memory cell blocks ((MB0, MB1), (MB1, MB2), . . . , or (MBN-1, MBN)) respectively share one sense amplifier unit 220 placed between them.

Each of the sense amplifier units 210 arranged at the edge of the memory cell array 200 includes a bit line sense amplifier 211, an isolation transistor unit 212, and an equalizing and precharging unit 213. The isolation transistor unit 212 connects the memory cell block MB0 to the bit line sense amplifier 211.

Each of the sense amplifier units 220 arranged within the memory cell array 200 includes a bit line sense amplifier 221, two isolation transistor units 222 and 223, and two equalizing and precharging units 224 and 225. The two isolation transistor units 222 and 223 connect one of the memory cell blocks MB1 and MB2 to the bit line sense amplifier 221. Particularly, the isolation transistor 222 connects the memory cell block MB1 to the bit line sense amplifier 221 in response to a first isolation signal Piso__1.

In the case of sensing the data of the memory cell block MB1, the isolation transistor unit 223 is turned off in response to a second isolation signal Piso__2, and thus, the memory cell block MB2 is not connected to the bit line sense amplifier 221. At the same time, the equalizing and precharging unit 225 precharges bit lines BL and BLB of the memory cell block MB2 to a precharge voltage level.

If selection of the memory cell block MB1 is canceled, in other words, if operation of the bit line sense amplifier 221 for sensing and amplifying the data of memory cells MC0 and MC1 is stopped, the bit line BL and its complementary bit line /BL of the memory cell block MB1 are precharged to a voltage level VBL by the equalizing and precharging unit 224.

At the same time, as mentioned above, the bit line BL and complementary bit line /BL of the memory cell block MB2 have been precharged by the equalizing and precharging unit 225. If the isolation transistor units 222 and 223 are turned on in response to the first and second isolation signals Piso__1 and Piso__2, the bit line BL and complementary bit line /BL of the memory cell block MB1 are connected to the bit line BL and complementary bit line /BL of the memory cell block MB2, respectively.

The speed of precharging the bit line BL and complementary bit line /BL of the memory cell block MB1 is determined by the bit line BL and complementary bit line /BL of the memory cell block MB2, as well as the equalizing and precharging unit 224. However, the memory cell blocks MB0 and MBN placed at the edge of the memory cell array 200 do not have any counterpart placed at the opposite side and sharing the bit line sense amplifier 211, and thus, the speed of precharging the bit line BL and complementary bit line /BL of each of the memory cell blocks MB0 and MBN is determined by only the equalizing and precharging unit 213.

The speed of precharging the bit line BL and complementary bit line /BL of each of the memory cell blocks MB0 and MBN is thus lower than the speed of precharging the bit line BL and complementary bit line /BL of each of the memory cell blocks MB1 through MBN-1. Therefore, as more memory cells are allotted to each of the memory cell blocks MB0 through MBN, the speed of precharging the bit line BL and the complementary bit line /BL is reduced more considerably. This is because the load on the length of the bit line BL and complementary bit line /BL connected to the memory cells, that is, the amount of electric charge stored in a line capacitor, is not a negligible amount.

Accordingly, the bit line precharge time tRP of the memory cell blocks MB1 through MBN-1 placed at the inner part of the memory cell array 200 is different from that of the memory cell blocks MB0 and MBN located at the edge of the memory cell array 200. Thus, the operational speed of a DRAM is restricted by the precharge time tRP of the memory cell blocks MB0 and MBN, so that the DRAM cannot operate at a high speed. Therefore, a memory cell array structure capable of reducing the precharge time tRP of the memory cell blocks MB0 and MBN placed at its edge is required.

SUMMARY OF THE INVENTION

The present invention is therefore directed to a semiconductor memory device which substantially overcomes one or more of the problems due to the limitations and disadvantages of the related art.

To solve the above problems, it is a first object of the present invention to provide a memory cell array structure which is capable of reducing precharge time.

It is a second object of the present invention to provide a method of precharging a bit line which is capable of reducing precharge time.

Accordingly, to achieve the first and other objects, there is provided a semiconductor memory device having a memory cell array structure which includes memory cell blocks in each of which a plurality of memory cells are arranged; a first sense amplifier unit arranged between two adjacent memory cell blocks among the memory cell blocks and shared by the two adjacent memory cell blocks, that senses and amplifies the data of the memory cells; a second sense amplifier unit connected to a memory cell block at an edge of the memory cell array structure, which senses and amplifies the data of the memory cells; and a dummy capacitor region including a plurality of capacitors connected between a dummy bit line and a complementary dummy bit line, which are connected to a bit line and a complementary bit line of the memory cell block at the edge of the memory cell array structure.

The capacitors may have a capacitance equal to the line capacitance of the bit line. The capacitors may consist of cell capacitors of the memory cells.

A dummy capacitor region according to a further embodiment of the present invention includes a plurality of capacitors connected between a power supply and either a dummy bit line or a complementary dummy bit line, which is connected to a bit line or a complementary bit line of the memory cell block at the edge of the memory cell array structure.

A dummy capacitor region according to a still further embodiment of the present invention includes a plurality of capacitors connected between a dummy bit line and a complementary dummy bit line, one end of the plurality of capacitors being connected to a bit line and a complementary bit line of the memory cell block at the edge of the memory cell array structure, and the other end of the plurality of capacitor being connected to a power supply.

To achieve the second and other objects, there is provided a method of precharging a bit line in a semiconductor memory device having a common sense amplifier structure, including precharging a plurality of capacitors connected between a dummy bit line and a complementary dummy bit line in a dummy capacitor region; disconnecting the dummy bit line and the complementary dummy bit line from a bit line sense amplifier; connecting a bit line and a complementary bit line of a memory cell block to the bit line sense amplifier and sensing memory cell data; stopping operation of the bit line sense amplifier and precharging the bit line and the complementary bit line; and connecting the bit line and the complementary bit line to the dummy bit line and the complementary dummy bit line, respectively.

According to the semiconductor memory device having the memory cell array structure of the present invention, the speed of precharging the bit line and complementary bit line of a memory cell block arranged at an edge of the memory cell array structure is almost the same as the speed of precharging the bit line and complementary bit line of a memory cell block arranged at an inner part of the memory cell array structure.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

The present invention now will be described more fully with reference to the accompanying drawings, in which preferred embodiments of the invention are shown.

Figure 1:
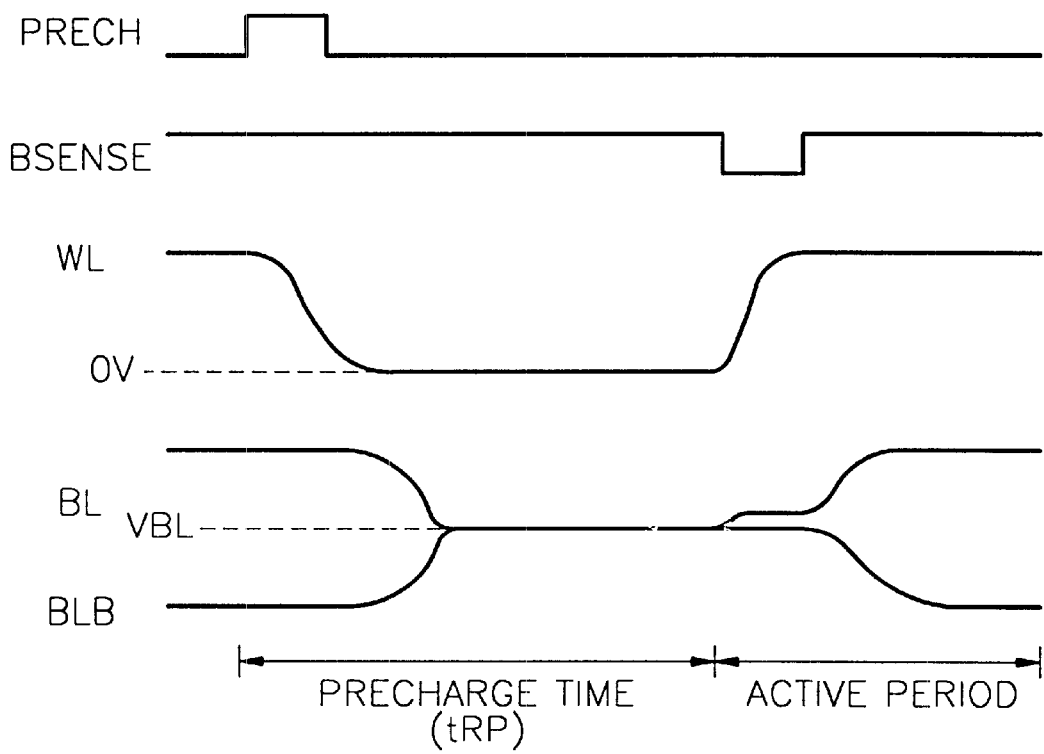
FIG. 1 is a timing diagram of precharge time within a semiconductor memory device.
Figure 2:
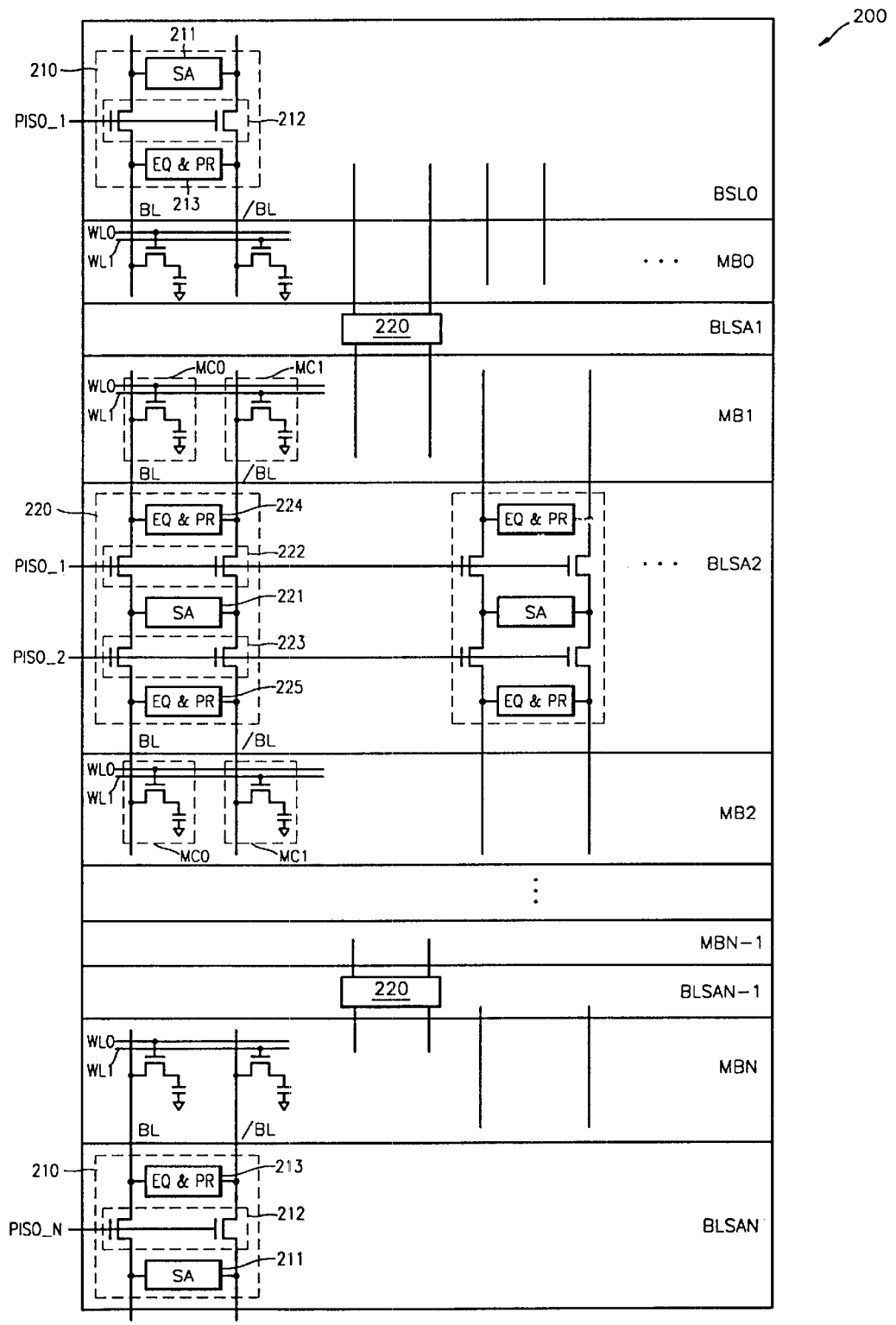
FIG. 2 is a diagram of a conventional memory cell array structure.
Figure 3:
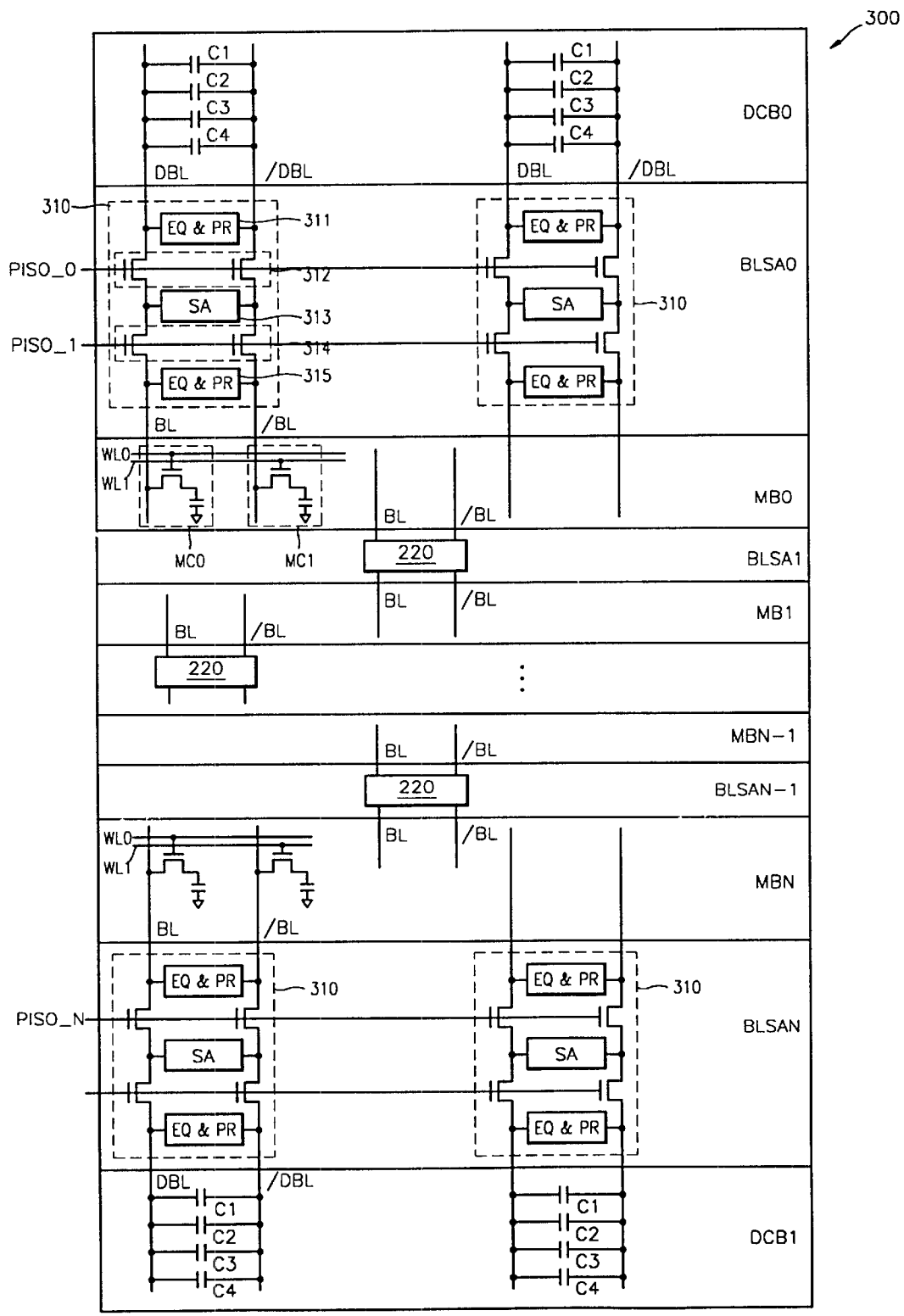
FIG. 3 is a diagram of a memory cell array structure according to an embodiment of the present invention.

In FIG. 3, which is a diagram of a memory cell array structure 300 according to an embodiment of the present invention, the memory cell array structure has almost the same structure as the memory cell array structure 200 shown in FIG. 2, except for second sense amplifier blocks BLSA0 and BLSAN and dummy capacitor regions DCB0 and DCB1 connected to the sense amplifier units BLSA0 and BLSAN, respectively. Therefore, the same reference numerals in FIGS. 2 and 3 represent the same elements.

The memory cell array structure 300 includes a plurality of memory cell blocks MB0 through MBN, first sense amplifier blocks BLSA1 through BLSAN-1, memory cell blocks MB0 and MBN placed at respective edges of the memory cell array structure, second sense amplifier blocks BLSA0 and BLSAN and the dummy capacitor regions DCB0 and DCB1 connected to the second sense amplifier blocks BLSA0 and BLSAN, respectively.

Sense amplifiers 220 arranged at each of the first sense amplifier blocks BLSA1 through BLSAN-1, which are the same as the sense amplifier unit 220 shown in FIG. 2, are respectively shared by one of the first sense amplifier blocks BLSA1 through BLSAN-1 and two memory cell blocks adjacent to it. Thus, description of sense amplifiers 220 will not be repeated here. In addition, the second dummy capacitor region DCB1 is almost the same as the first dummy capacitor region DCB0, and thus, only the first dummy capacitor region DCB0 will be described in detail.

The second sense amplifier block BLSA0 includes a sense amplifier unit 310 connected to a pair of bit lines BL and /BL of the first memory cell block MB0. The sense amplifier unit 310 includes a first equalizing and precharging unit 311, a first isolation transistor unit 312, a bit line sense amplifier 313, a second isolation transistor unit 314 and a second equalizing and precharging unit 315.

The first equalizing and precharging unit 311 precharges a pair of dummy bit lines DBL and /DBL of the dummy capacitor region DCB0. During the precharging, the first isolation transistor unit 312 disconnects the dummy bit lines DBL and /DBL from the bit line sense amplifier 313 in response to a first isolation signal PISO_0. Also, the second isolation transistor unit 314 disconnects the bit lines of the first memory cell block MB0 in response to a second isolation signal PISO_1. The second equalizing and precharging unit 315 precharges the bit lines BL and /BL of the first memory cell block MB0.

The bit line sense amplifier 313 senses the data of memory cells MC0 and MC1 in the first memory cell block MB0. During the sensing, the second equalizing and precharging unit 315 is turned off and the second isolation transistor unit 314 is turned on. As a result, the bit lines BL and /BL of the first memory cell block MB0 are connected to the sense amplifier 313.

The first dummy capacitor region DCB0 includes a plurality of capacitors C1, C2, C3 and C4 placed between the dummy bit line DBL and the complementary dummy bit line /DBL. The capacitors C1, C2, C3 and C4 are precharged by the first equalizing and precharging unit 311 and are set to have a particular value equivalent to the line capacitance of the bit line BL and complementary bit line /BL of the first memory cell block MB0. For example, the capacitors C1, C2, C3 and C4 may be DRAM cell capacitors.

The operation of the sense amplifier unit 310 is as follows. Supposing that the first memory cell block MB0 is selected, the second equalizing and precharging unit 315 is turned off and the second isolation transistor unit 314 is turned on in response to the second isolation signal PISO_1. Also, the first isolation transistor unit 312 is turned off and the first equalizing and precharging unit 311 is turned on. The precharging unit 311 precharges the dummy bit line DBL and the complementary dummy bit line /DBL.

The bit line BL and complementary bit line /BL of the first memory cell block MB0 are connected to the bit line sense amplifier 313 through the turned-on second isolation transistor unit 314. The bit line sense amplifier 313 senses and amplifies the data of the memory cells MC0 and MC1 selected by an active word line WL0 among the memory cells connected to the bit line BL and the complementary bit line /BL.

On the other hand, if the first memory cell block MB0 is not selected, the second equalizing and precharging unit 315 is turned on and precharges the bit line BL and complementary bit line /BL of the first memory cell block MB0 to a precharge voltage level. The first isolation transistor unit 312 is turned on in response to activation of the first isolation signal PISO_0. Then, the bit line BL, and the complementary bit line /BL are connected to the first dummy bit line DBL and the complementary dummy bit line /DBL, respectively, via the first isolation transistor unit 312 that is turned on and the second isolation transistor unit 314 which has already been turned on.

As a result, the bit line BL and the complementary bit line /BL are precharged to a precharge voltage level by the electric charge stored in the capacitors C1, C2, C3 and C4 of the first dummy capacitor region DCB0 as well as the second equalizing and precharging unit 315.

The bit line BL and complementary bit line /BL of the memory cell block MB0 are precharged by the bit line BL and complementary bit line /BL of the memory cell block MB0, and the dummy bit line DBL and complementary dummy bit line /DBL of the first dummy capacitor region DCB0, in the same way that the bit line BL and complementary bit line /BL of the memory cell blocks MB1 through MBN-1 which are arranged at the inner part of the memory cell array 200 of FIG. 2 are precharged by the bit line BL and complementary bit line /BL of another memory cell block paired with the memory cell block.

The speed of precharging the bit line BL and complementary bit line /BL of each of the memory cell blocks MB0 and MBN at the edges of the memory cell array structure 300 becomes almost the same as the speed of precharging the bit line BL and complementary bit line /BL of each of the memory cell blocks MB1 through MBN-1 arranged at the inner part of the memory cell array structure 300. Therefore, it is possible to solve the problem of the conventional memory cell array structure 200 whereby the precharge time tRP of the memory cell blocks placed at the inner part of the memory cell array structure 200 is different from that of the memory cell blocks placed at the edges of the memory cell array structure 200.

Figure 4:
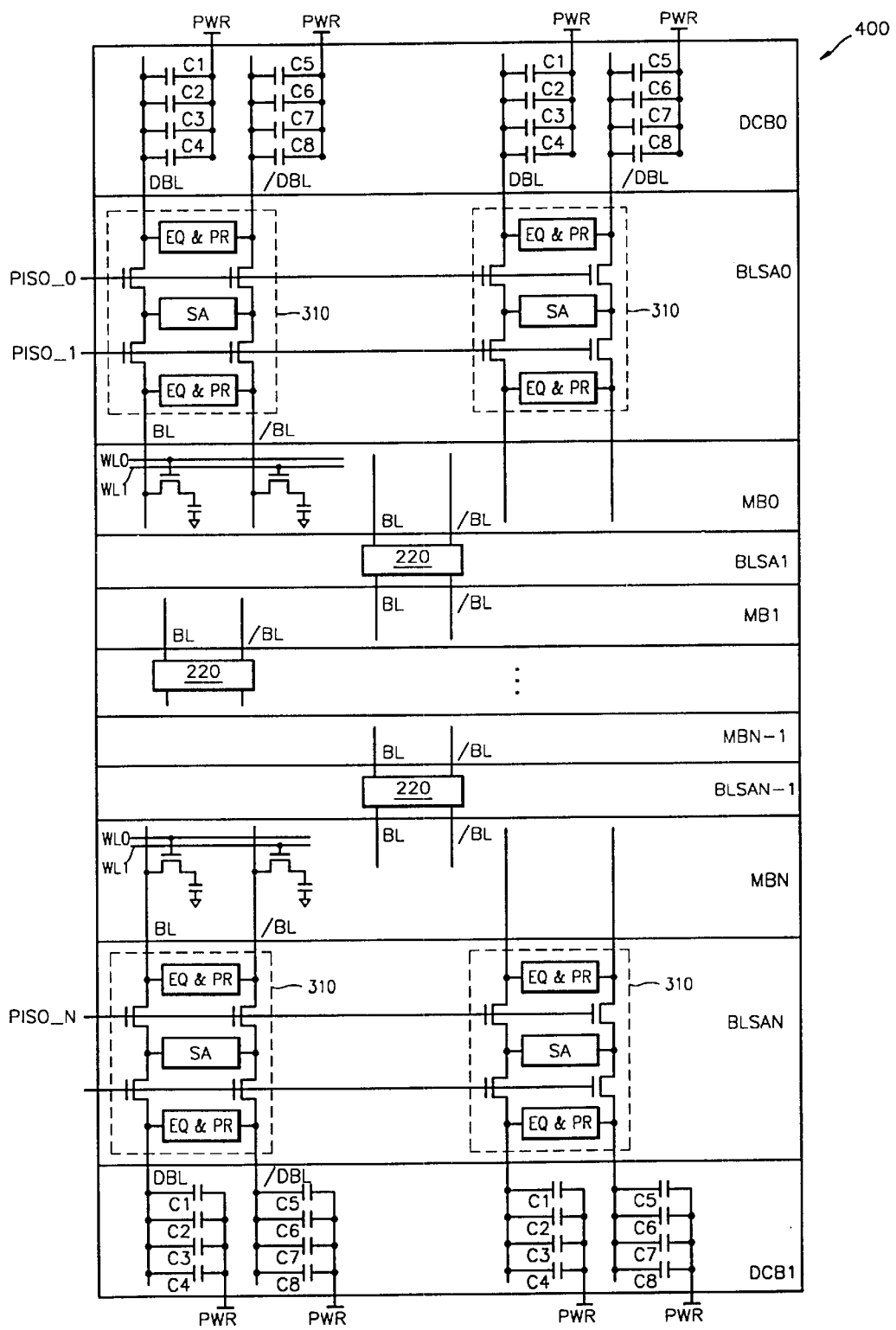
FIG. 4 is a diagram of a memory cell array structure according to a further embodiment of the present invention.

FIG. 4 is a diagram of a semiconductor memory device having a memory array structure 400 according to a further embodiment of the present invention. The memory array structure 400 is almost the same as the memory cell array structure 300 shown in FIG. 4, except for dummy capacitor regions DCB0 and DCB1.

Each of the dummy capacitor regions DCB0 and DCB1 includes a plurality of first capacitors C1, C2, C3 and C4 connected between a dummy bit line DBL and a power supply PWR, and a plurality of second capacitors C5, C6, C7 and C8 connected between a complementary dummy bit line /DBL and the power supply PWR. Each of the first and second capacitors C1, C2, C3, C4, C5, C6, C7 and C8 are precharged to a precharge voltage level by a first equalizing and precharging unit 311. The operation of the memory cell array structure is the same as that of the memory cell array structure 300 of FIG. 3. In the semiconductor device of this embodiment, precharge time tRP is reduced and the speed of precharging a dummy bit line DBL and a complementary dummy bit line /DBL of memory cell blocks at the edge of the device is improved, as compared to conventional devices.

Figure 5:
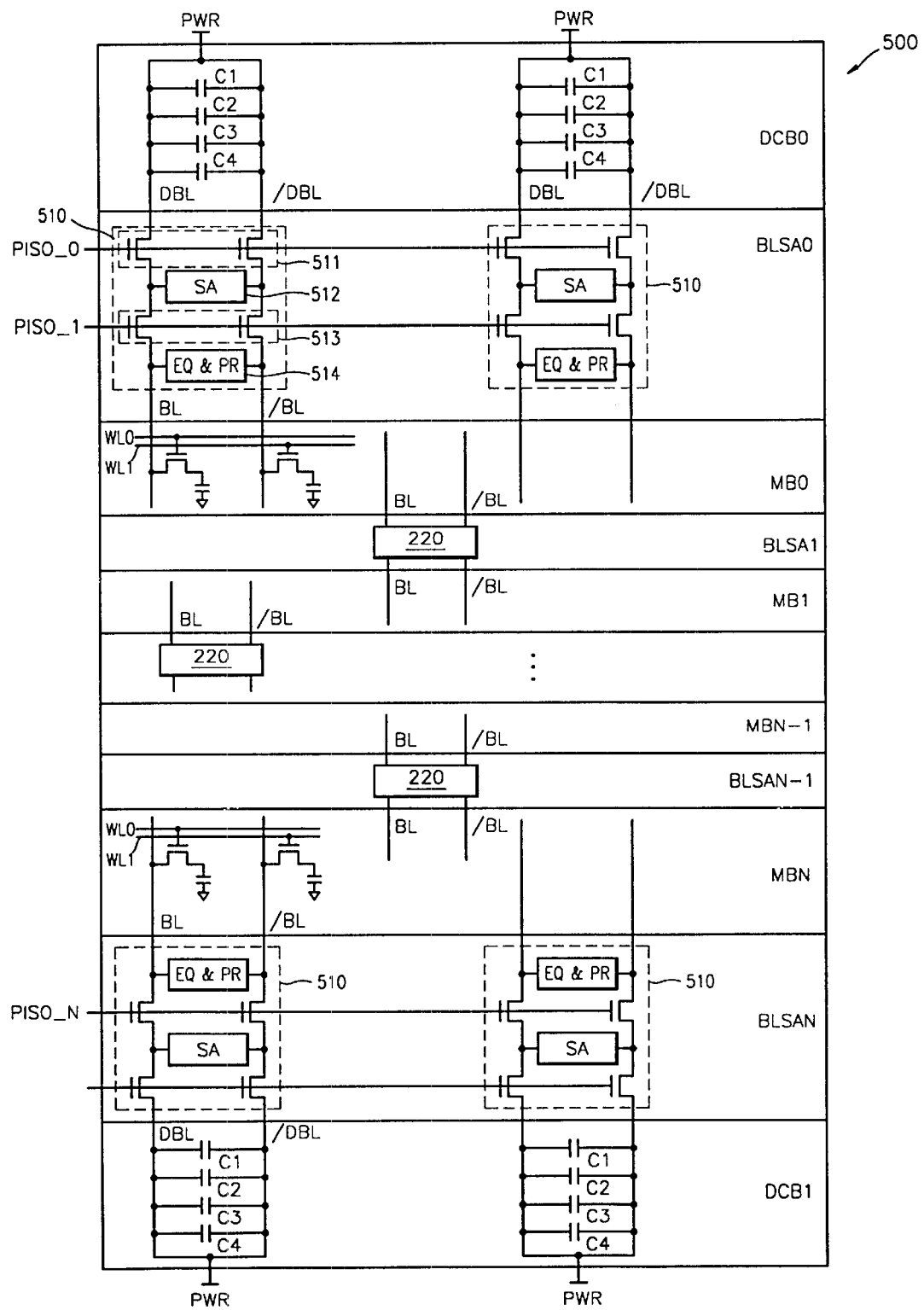
FIG. 5 is a diagram of a memory cell array structure according to a still further embodiment of the present invention.

FIG. 5 is a diagram of a semiconductor memory device having a memory cell array structure 500 according to a still further embodiment of the present invention. The memory cell array structure 500 is almost the same as the memory cell array structure 300 of FIG. 3, except for dummy capacitor regions DCB0 and DCB1 and first sense amplifier blocks BLSA0 and BLSAN.

The first dummy capacitor region DCB0 includes first through fourth capacitors C1 through C4 connected between a dummy bit line DBL and a complementary dummy bit line /DBL which are connected to a power supply PWR.

A sense amplifier unit 510 arranged at the first sense amplifier block BLSA0 includes a first isolation transistor unit 511, a bit line sense amplifier 512, a second isolation transistor unit 513 and a first equalizing and precharging unit 514. However, the sense amplifier 510 unit does not include an equalizing and precharging unit for precharging the dummy bit line DBL and complementary dummy bit line /DBL as in equalizing and precharging unit 311 of the sense amplifier 310 shown in FIG. 3. In the sense amplifier unit 510, the power supply, which is connected to the dummy bit line DBL and the complementary dummy bit line /DBL, acts as an equalizing and precharging unit. Thus, in the case of the sense amplifier unit 510, the operation of the first equalizing and precharging unit 311 as in sense amplifier 310 of FIG. 3 is not necessary, because the dummy bit line DBL and the complementary dummy bit line /DBL are forcibly precharged by the power supply.

In the cases of the second and third embodiments of the present invention as well as the first embodiment, the bit line BL and complementary bit line/BL of the memory cell block placed at the edge of the memory cell array structure are precharged by the bit line BL and the complementary bit line /BL and by the dummy bit line DBL and complementary dummy bit line /DBL of the first dummy capacitor region DCB0. As a result, the speed of precharging the bit line BL and complementary bit line /BL of each of the memory cell blocks MB0 and MBN at the edges of the memory cell array structure becomes close to the speed of precharging the bit line BL and complementary bit line /BL of each of the memory cell blocks MB1 through MBN-1 arranged at the inner part of the memory cell array structure. Therefore, it is possible to solve the problem of the conventional memory cell array structure 200 whereby the precharge time tRP of a memory cell block arranged at the inner part of the memory cell array structure is different from a memory cell block arranged at the edge of the memory cell array structure.

According to the semiconductor memory device having the memory cell array structure of the present invention, the speed of precharging the bit line and complementary bit line of a memory cell block arranged at the edge of a memory cell array structure is almost the same as the speed of precharging the bit line and complementary bit line of a memory cell block arranged at the inner part of the memory cell array structure. Therefore, it is possible to solve the problem of the conventional memory cell array structure whereby the precharge time of a memory cell block at the inner part of the conventional memory cell array structure is different from that of a memory cell block at the edge of the conventional cell array structure.

It is to be understood that the description and figures are not to be construed as limiting. For instance, although four capacitors C1–C4 are shown as coupled to the dummy bit line DBL and the complementary dummy bit line /DBL as in FIG. 3 for example, any number of capacitors may be connected to the dummy bit lines, as long as the capacitors are precharged and are set to have a particular value substantially equal to the line capacitance of the bit line BL and the complementary bit line /BL of the first memory cell block MB0. Similarly, any number of capacitors may be coupled to the dummy bit lines of FIGS. 4 and 5, as long as the capacitors are precharged and are set to have a particular value substantially equal to the line capacitance of the particular bit lines.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor memory device comprising:
    memory cell blocks arranged in a memory cell array structure, each of the memory cell blocks having a plurality of memory cells therein;
    a first sense amplifier unit, arranged between two adjacent memory cell blocks and shared by the two adjacent memory cell blocks, that senses and amplifies data of the memory cells;
    a second sense amplifier unit connected to a memory cell block at an edge of the memory cell array structure, that senses and amplifies data of the memory cells; and
    a dummy capacitor region having a plurality of capacitors connected between a dummy bit line and a complementary dummy bit line, the dummy bit line and the complementary dummy bit line being respectively connected to a bit line and a complementary bit line of the memory cell block at the edge of the memory cell array structure.

2. The semiconductor memory device of claim 1, wherein the capacitors have a capacitance equal to a line capacitance of the bit line.

3. The semiconductor memory device of claim 1, wherein the capacitors consist of cell capacitors of the memory cells.

4. The semiconductor memory device of claim 1, wherein the first sense amplifier unit comprises:
    a bit line sense amplifier connected to the memory cells, that senses and amplifies data on bit lines of the two adjacent memory cell blocks;
    a first equalizing and precharging unit that precharges a pair of a bit line and a complementary bit line of a first memory cell block located adjacent a first side of the bit line sense amplifier;
    a first isolation transistor unit that selectively connects the pair of the bit line and the complementary bit line of the first memory cell block to the bit line sense amplifier;
    a second equalizing and precharging unit that precharges a pair of a bit line and a complementary bit line of a second memory cell block located adjacent a second side of the bit line sense amplifier; and
    a second isolation transistor unit that selectively connects the pair of the bit line and the complementary bit line of the second memory cell block to the bit line sense amplifier.

5. The semiconductor memory device of claim 1, wherein the second sense amplifier unit comprises:
    a bit line sense amplifier connected to the memory cells of the memory cell block at the edge of the memory cell array structure, that senses and detects data on the bit line and the complementary bit line;
    a first equalizing and precharging unit that precharges the dummy bit line and the complementary dummy bit line;
    a first isolation transistor unit that selectively connects the dummy bit line and the complementary dummy bit line respectively to the bit line and the complementary bit line of the memory cell block at the edge of the memory cell array structure;
    a second equalizing and precharging unit that precharges the bit line and the complementary bit line of the memory cell block at the edge of the memory cell array structure; and
    a second isolation transistor unit that selectively connects the bit line and the complementary bit line of the memory cell block at the edge of the memory cell array structure to the bit line sense amplifier.

6. A semiconductor memory device comprising:
    memory cell blocks arranged in a memory cell array structure, each of the memory cell blocks having a plurality of memory cells therein;
    a first sense amplifier unit, arranged between two adjacent memory cell blocks and shared by the two adjacent memory cell blocks, that senses and amplifies data of the memory cells;
    a second sense amplifier unit connected to a memory cell block at an edge of the memory cell array structure, that senses and amplifies data of the memory cells; and
    a dummy capacitor region having a plurality of capacitors connected between a power supply and either a dummy bit line or a complementary dummy bit line, the dummy bit line and the complementary bit line being respectively connected to a bit line and a complementary bit line of the memory cell block at the edge of the memory cell array structure.

7. The semiconductor memory device of claim 6, wherein the capacitors have a capacitance equal to a line capacitance of the bit line.

8. The semiconductor memory device of claim 6, wherein the capacitors consist of cell capacitors of the memory cells.

9. The semiconductor memory device of claim 6, wherein the first sense amplifier unit comprises:
   a bit line sense amplifier connected to the memory cells, that senses and amplifies data on bit lines of the two adjacent memory cell blocks;
   a first equalizing and precharging unit that precharges a pair of a bit line and a complementary bit line of a first memory cell block located adjacent a first side of the bit line sense amplifier;
   a first isolation transistor unit that selectively connects the pair of the bit line and the complementary bit line of the first memory cell block to the bit line sense amplifier;
   a second equalizing and precharging unit that precharges a pair of a bit line and a complementary bit line of a second memory cell block located adjacent a second side of the bit line sense amplifier; and
   a second isolation transistor unit that selectively connects the pair of the bit line and the complementary bit line of the second memory cell block to the bit line sense amplifier.

10. A semiconductor memory device comprising:
    memory cell blocks arranged in a memory cell array structure, each of the memory cell blocks having a plurality of memory cells therein;
    a first sense amplifier unit, arranged between two adjacent memory cell blocks and shared by the two adjacent memory cell blocks, that senses and amplifies data of the memory cells;
    a second sense amplifier unit connected to a memory cell block at an edge of the memory cell array structure, that senses and amplifies data of the memory cells; and
    a dummy capacitor region having a plurality of capacitors connected between a dummy bit line and a complementary dummy bit line, both ends of the capacitors being connected respectively to a bit line and a complementary bit line of the memory cell block at the edge of the memory cell array structure and being connected to a power supply.

11. The semiconductor memory device of claim 10, wherein the capacitors have a capacitance equal to a line capacitance of the bit line.

12. The semiconductor memory device of claim 10, wherein the capacitors consist of cell capacitors of the memory cells.

13. The semiconductor memory device of claim 10, wherein the first sense amplifier unit comprises:
    a bit line sense amplifier connected to the memory cells, that senses and amplifies data of bit lines of the two adjacent memory cell blocks;
    a first equalizing and precharging unit that precharges a pair of a bit line and a complementary bit line of a first memory cell block located adjacent a first side of the bit line sense amplifier;
    a first isolation transistor unit that selectively connects the pair of the bit line and the complementary bit line of the first memory cell block to the bit line sense amplifier;
    a second equalizing and precharging unit that precharges a pair of a bit line and a complementary bit line of a second memory cell block located adjacent a second side of the bit line sense amplifier; and
    a second isolation transistor unit that selectively connects the pair of the bit line and the complementary bit line of the second memory cell block to the bit line sense is amplifier.

14. The semiconductor memory device of claim 10, wherein the second sense amplifier unit comprises:
    a bit line sense amplifier connected to the memory cell block at the edge of the memory cell array structure, that senses and detects data of the bit line and the complementary bit line;
    a first isolation transistor unit that selectively connects the dummy bit line and the complementary dummy bit line respectively to the bit line and the complementary bit line of the memory cell block at the edge of the memory cell array structure;
    an equalizing and precharging unit that precharges the bit line and the complementary bit line of the memory cell block at the edge of the memory cell array structure; and
    a second isolation transistor unit that selectively connects the bit line and the complementary bit line of the memory cell block at the edge of the memory cell array structure to the bit line sense amplifier.

15. A method of precharging a bit line in a semiconductor memory device having a common sense amplifier structure, comprising:
    precharging a plurality of capacitors connected between a dummy bit line and a complementary dummy bit line in a dummy capacitor region;
    disconnecting the dummy bit line and the complementary dummy bit line from a bit line sense amplifier;
    connecting a bit line and a complementary bit line of a memory cell block to the bit line sense amplifier and sensing memory cell data;
    stopping operation of the bit line sense amplifier and precharging the bit line and the complementary bit line; and
    connecting the bit line and the complementary bit line to the dummy bit line and the complementary dummy bit line, respectively.

16. The method of precharging a bit line of claim 15, wherein said precharging comprises equalizing and precharging the capacitors with an equalizing and precharging unit connected between the dummy bit line and the complementary dummy bit line.

17. The method of precharging a bit line of claim 15, wherein said precharging comprises precharging the capacitors with a power supply connected between the dummy bit line and the complementary dummy bit line.

* * * * *